(12) United States Patent
Park

(10) Patent No.: US 8,869,418 B2
(45) Date of Patent: Oct. 28, 2014

(54) APPARATUS FOR FABRICATING DISPLAY DEVICE

(75) Inventor: Sang Ho Park, Goyang-si (KR)

(73) Assignee: LG Display Co. Ltd., Seoul (KR)

( * ) Notice: Subject to any disclaimer, the term of this patent is extended or adjusted under 35 U.S.C. 154(b) by 694 days.

(21) Appl. No.: 12/603,890

(22) Filed: Oct. 22, 2009

(65) Prior Publication Data
US 2010/0107981 A1  May 6, 2010

(30) Foreign Application Priority Data
Oct. 31, 2008 (KR) ........................ 10-2008-0107863

(51) Int. Cl.
F26B 25/06 (2006.01)
F26B 13/30 (2006.01)
F26B 5/04 (2006.01)
H01L 21/67 (2006.01)
G02F 1/13 (2006.01)

(52) U.S. Cl.
CPC ........ *H01L 21/67109* (2013.01); *G02F 1/1303* (2013.01)
USPC ...................... 34/226; 34/92; 34/406; 34/412

(58) Field of Classification Search
USPC ........... 34/406, 412, 202, 225, 233, 408, 410, 34/493, 509, 92, 201, 199, 226, 227, 287; 228/246, 218–220; 165/9.3, 9.4; 118/50, 58, 59, 61; 219/121.43, 219/121.58, 411, 444.1, 543, 635
See application file for complete search history.

(56) References Cited

U.S. PATENT DOCUMENTS

| 5,304,250 A | * | 4/1994 | Sameshima et al. ..... 118/723 ER |
| 6,905,063 B2 | * | 6/2005 | Morozumi et al. ............ 228/246 |
| 7,097,735 B2 | * | 8/2006 | Ohmi et al. .............. 156/345.41 |
| 2005/0205015 A1 | * | 9/2005 | Sasaki et al. ........... 118/723 MA |

FOREIGN PATENT DOCUMENTS

| JP | 01-258423 | | 10/1989 |
| JP | 07-050290 | | 2/1995 |
| KR | 1020000008048 A | | 2/2000 |
| KR | 2006066552 A | * | 6/2006 |

OTHER PUBLICATIONS

Office Action issued in corresponding Korean Patent Application No. 10-2008-0107863, mailed May 24, 2013, 5 pages.

* cited by examiner

*Primary Examiner* — Kenneth Rinehart
*Assistant Examiner* — John McCormack
(74) *Attorney, Agent, or Firm* — Brinks Gilson & Lione

(57) ABSTRACT

A fabrication apparatus of a display that is adaptive for improving reliability is disclosed. The fabrication apparatus of a display device includes a chamber for vacuum heating; a hot plate disposed on the inside of the chamber; a plurality of external pipes that are disposed on the outside of the chamber, and to which vent gas for converting the atmospheric pressure of the inside of the chamber, which is in a vacuum state, into the atmospheric pressure of the outside is supplied; a gas outlet tube, which is extended from the external pipe and disposed on the inner side surface of the chamber in order to discharge the vent gas; and a gas heating part which is disposed on each of the external pipe and heats up the vent gas supplied from the outside.

7 Claims, 4 Drawing Sheets

APPARATUS FOR FABRICATING DISPLAY DEVICE

This application claims the benefit of Korea Patent Application No. 10-2008-0107863 filed on Oct. 31, 2008, the entire contents of which is incorporated herein by reference for all purposes as if fully set forth herein.

BACKGROUND

1. Field of the Invention

This disclosure relates to an apparatus for fabricating a display device, and more particularly to an apparatus for fabricating a display device that is adaptive for improving reliability.

2. Discussion of the Related Art

A liquid crystal display device is a type of a flat display device that displays an image by use of liquid crystal, and is widely used because of its advantages, including that it is thinner than other display devices and its power consumption is low.

The liquid crystal display device includes a liquid crystal display panel for displaying an image, and a backlight unit for supplying light to the liquid crystal display panel.

In general, the liquid crystal display panel is formed in a structure that a liquid crystal layer is interposed between substrates which face each other.

The fabrication process of the liquid crystal display panel includes a thin film deposition process of forming a thin film at the surface of a substrate, a photo lithography process of exposing a selected part of the thin film, an etching process of patterning it to remove the exposed part of the thin film, and various processes such as cleaning, bonding and cutting. And, the thin film deposition process, the photo lithography process and the etching process are repeated several times before being completed After cleaning the patterned substrate, a process of applying heat to the substrate while keeping the substrate in a vacuum state is carried out in order to eliminate moisture and impurities on the patterned substrate.

The process of applying heat to the substrate in the vacuum state is carried out with a vacuum heating device.

The vacuum heating device has a heating source within a chamber and the substrate is transferred into the chamber in the vacuum heating process.

The inside of the chamber has a high temperature environment in the vacuum state so that the moisture or impurities on the substrate could be removed, and a vent gas is supplied from the outside for the inside of the chamber to have the atmospheric pressure of the outside. And then, the substrate is transferred to the outside.

However, the general vacuum heating device has a problem in that, when the vent gas is injected into the chamber of a temperature of 100 degree centigrade in order to change the vacuum state to a normal atmospheric pressure, moisture is condensed on the surface of the substrate by the instantaneous temperature difference as the vent gas of the low temperature (below around 25 degree centigrade) is supplied from the outside into the chamber of the high temperature.

Also, the general vacuum heating device has a problem in that a vent gas outlet is clogged when used for a long time because the moisture or impurities vaporized from the substrate are adhered at a gas outlet area, through which the vent gas is supplied into the chamber, by the instantaneous temperature difference caused by the vent gas supply.

BRIEF SUMMARY

According to a general aspect of the present embodiment, a fabrication apparatus of a display device includes a vacuum heating chamber; a hot plate disposed on the inside of the chamber; a plurality of external pipes that are disposed on the outside of the chamber, and to which vent gas for converting the atmospheric pressure of the inside of the chamber, which is in a vacuum state, into the atmospheric pressure of the outside is supplied; a gas outlet tube, which is extended from the external pipe and disposed on the inner side surface of the chamber in order to discharge the vent gas; and a gas heating part, which is disposed on each of the external pipe and heats up the vent gas supplied from the outside.

According to another aspect of the present embodiment, a fabrication apparatus of a display device includes a vacuum heating chamber; a hot plate disposed on the inside of the chamber; a plurality of external pipes that are disposed on the outside of the chamber, and to which vent gas for converting the atmospheric pressure of the inside of the chamber, which is in a vacuum state, into the atmospheric pressure of the outside is supplied; an internal pipe extended from the external pipe and located on the inside of the chamber, and disposed at the lower part of the hot plate; and a gas outlet tube, which is extended from the internal pipe and discharges the vent gas into the chamber.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION OF THE DRAWINGS AND THE PRESENTLY PREFERRED EMBODIMENTS

Figure 1:
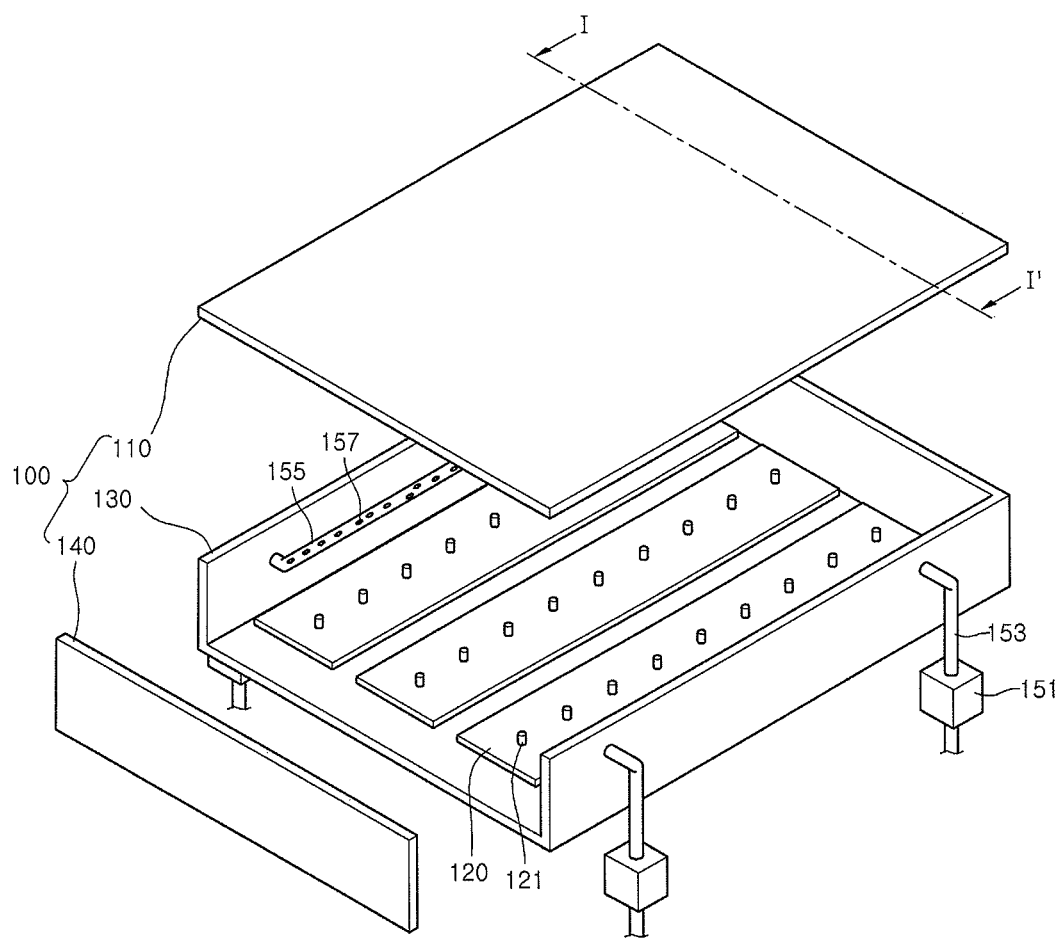
FIG. 1 is a view briefly illustrating a fabrication apparatus of a display device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
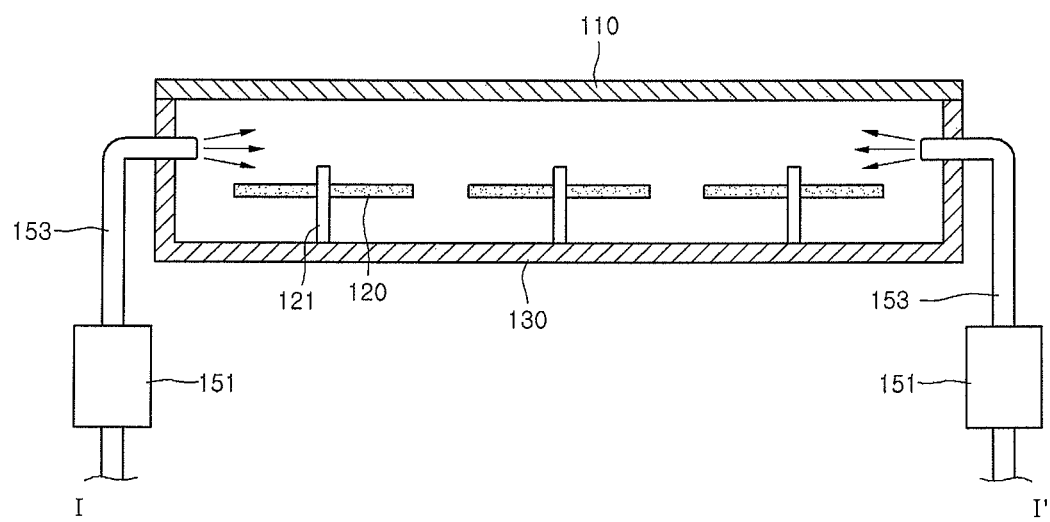
FIG. 2 is a sectional view illustrating a fabrication apparatus of a display device, taken along the line I-I' of FIG. 1.

FIG. 1 is a view briefly illustrating a fabrication apparatus of a display device according to an embodiment of the present disclosure, and FIG. 2 is a sectional view illustrating a fabrication apparatus of a display device taken along the line I-I' of FIG. 1.

As shown in FIGS. 1 and 2, a fabrication apparatus of a display device according to an embodiment of the present disclosure relates to a vacuum heating device that is used for eliminating moisture and impurities of the substrate where the cleaning process is completed after completion of the patterning.

The vacuum heating device includes a chamber 100 having an upper frame 110, a lower frame 130 of which the upper surface is open, and an open/close part 140 which is arranged at one side of the upper frame 110 and the lower frame 130 and through which the substrate is transferred in and out.

The vacuum heating apparatus further includes a hot plate 120 that is located within the chamber 100 and a heating source for applying heat to the substrate, and the hot plate 120 includes a plurality of support pins 121 for supporting the substrate.

The chamber 100 has in its side surface an external pipe 153 to which the vent gas of the outside is supplied, and a gas heating part 151 that heats up the vent gas at a temperature equivalent or similar to the temperature within the chamber 100.

The external pipes 153 are disposed to correspond to each other at the side surface of the chamber 100 and at least one or more of them are disposed on the basis of the side surface of the chamber 100.

The gas heating part 151 is located on the external pipe 153 and heats up the vent gas, which is injected into the chamber 100, at a temperature similar to the temperature within the chamber 100, thus even though the vent gas is injected into the chamber 100, the temperature of the inside of the chamber 100 is kept constantly, thereby preventing a condensing phenomenon that moisture is condensed on the surface of the substrate.

Herein, the vent gas is composed of compressed air, nitrogen N2, or etc.

In the inner surface of the chamber 100, a gas outlet 155 is extended from the external pipe 153, and a plurality of gas outlets 157 through which the vent gas is discharged are formed in the gas outlet 155 with a fixed distance.

In the inner surface of the chamber 100, a gas outlet tube 155 is extended from the external pipe 153, and a plurality of gas outlets 157 through which the vent gas is discharged are formed in the gas outlet tube 155 with a fixed distance.

As described above, the fabrication apparatus of the display device according to the embodiment of the present disclosure heats up the vent gas supplied into the chamber 100 from the outside at the outside and supplies the heated vent gas, thus it is possible to implement the fabrication apparatus of the display device of which the reliability increases by improving the problems such as a condensation phenomenon that moisture is condensed on the substrate because the internal temperature of the chamber 100 is rapidly increased and a problem that moisture and impurities are adhered and clogged at the gas outlet 157.

Figure 3:
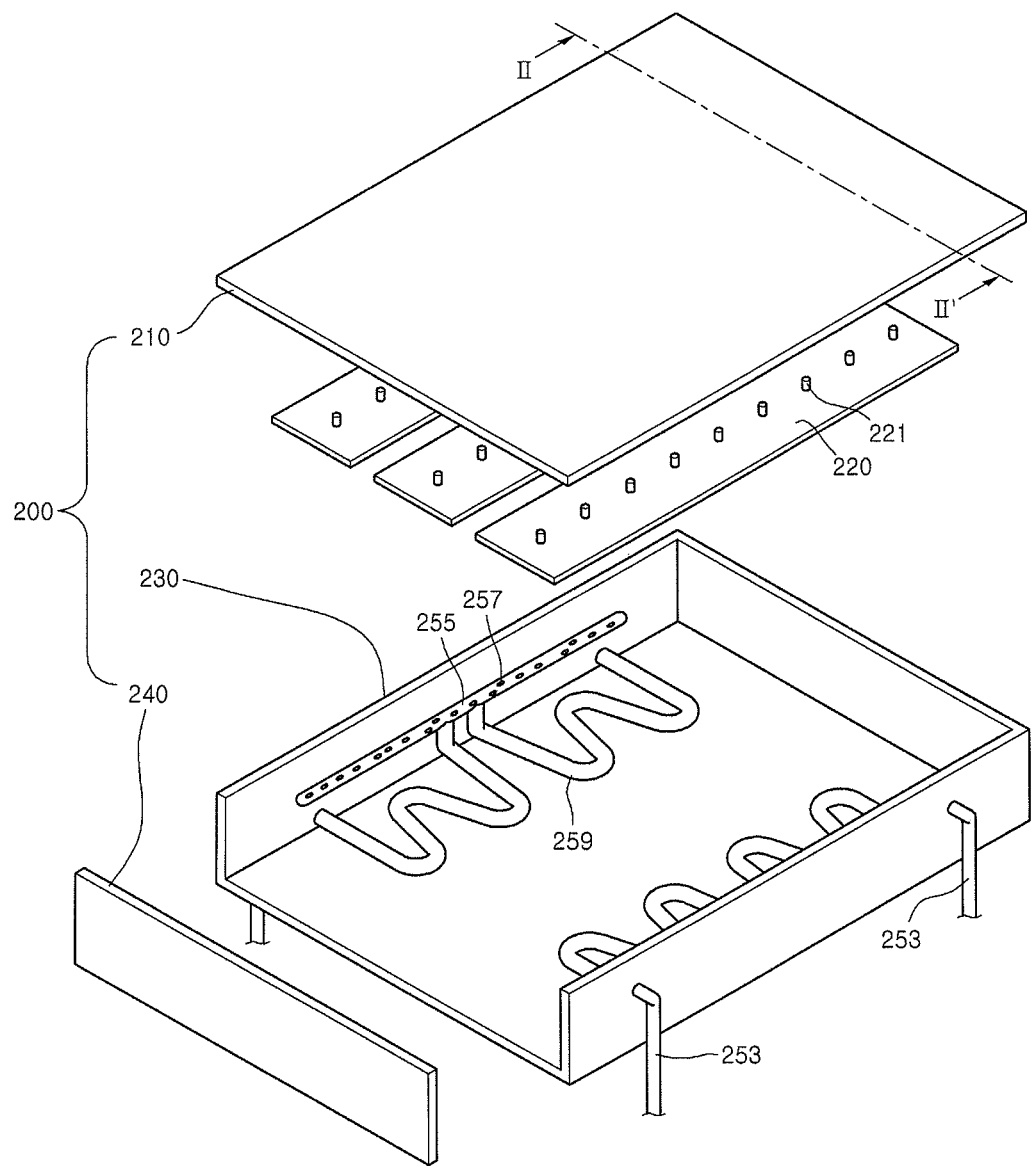
FIG. 3 is a view briefly illustrating a fabrication apparatus of a display device according to another embodiment of the present disclosure.
Figure 4:
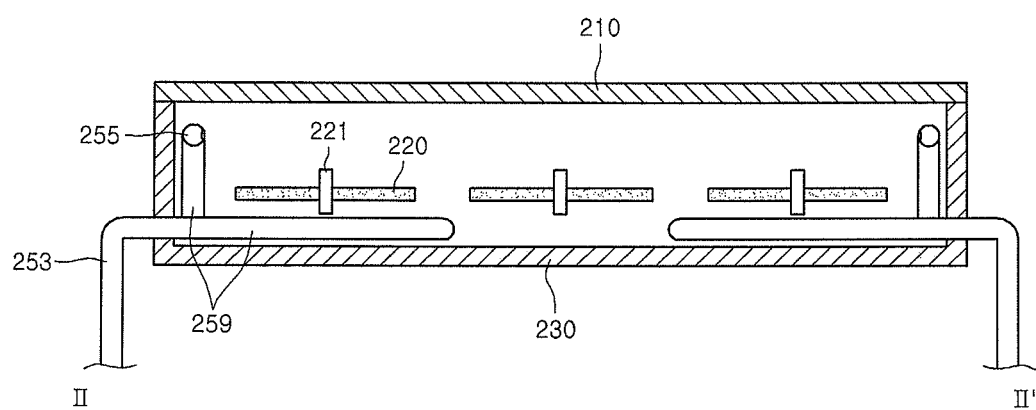
FIG. 4 is a sectional view illustrating a fabricating apparatus of a display device taken along the line II-II' of FIG. 3.

FIG. 3 is a view briefly illustrating a fabrication apparatus of a display device according to another embodiment of the present disclosure, and FIG. 4 is a sectional view illustrating a fabricating apparatus of a display device taken along the line II-II' of FIG. 3.

As shown in FIGS. 3 and 4, the fabrication apparatus of the display device according to another embodiment of the present disclosure is a vacuum heating device that cleans the substrate where the patterning is completed and eliminates the moisture or impurities of the cleaned substrate, and the vacuum heating device includes a chamber 200 having an upper frame 210, a lower frame 230, and an open/close part 240 which is disposed at one side of the upper frame 210 and the lower frame 230.

Herein, the disclosed embodiment, the chamber 200 was explained, in relation to the structure of the vacuum heating device, with respect to the structure of the upper frame 210, the lower frame 230 and the open/close part 240. However, the invention is not limited thereto, and might include all types of structures having a box shape for heating up the substrate.

A hot plate 220 is further included on the lower frame 230 of the chamber as a heating source that heats up the substrate, and a plurality of support pins 211 for supporting the substrate are disposed on the hot plate 220.

A plurality of external pipes 253 through which the external vent gas is supplied, an internal pipe 259 extended from the external pipe 253 and disposed at the inside of the chamber, and a gas outlet pipe 255 extended from the internal pipe 259 and disposed at the inner surface of the chamber 200 are disposed at the side surface of the chamber 200. The gas outlet pipe 255 has a plurality of gas outlets 257 through which the vent gas is discharged with a fixed distance.

At least one or more of the external pipes 253 are disposed at the side surface of the chamber 200, and preferably penetrate through the external side surface of the chamber 200 corresponding to each other.

The internal pipe 259 is extended from the external pipe 253, and the external pipe 253 penetrates into the chamber 200 through the chamber 200 and is disposed at the inside of the chamber 200.

The internal pipe 259 is disposed at the lower part of the hot plate 220, and has a structure of being bent at the lower area facing the lower plate 220. The internal pipe 259 was built in the structure of being bent at the lower part of the hot plate 220 in order to secure a sufficient heating time of the vent gas that passes through the internal pipe 259.

The internal pipe 259 is disposed at the lower part of the hot plate 220, and is heated by the heat generated from the hot plate 220. Accordingly, the vent gas passing through the internal pipe 259 is heated by the hot plate 220.

The internal pipe 259 according to another embodiment of the present disclosure is disposed at the lower part of the hot plate 220 and has a function of heating the vent gas supplied from the outside.

The both ends of the internal pipe 259 are connected to the external pipes 253.

The internal pipe 259 is bent from the inner side surface of the chamber 200 in an upper direction to be connected to the gas outlet pipe 255.

The vent gas discharged from the gas outlet pipe 255 is heated at a temperature similar to the internal temperature of the chamber 200 as it passes through the internal pipe 259.

The vacuum heating device according to another embodiment of the present disclosure has an internal pipe 259 disposed and extended from the external pipes 253 in the lower part direction of the hot plate 220 disposed within the chamber 200, and heats up the vent gas supplied from the internal pipe 259, thereby keeping the internal temperature of the chamber 200 constant even though the vent gas is supplied into the chamber 200 from the gas outlet 257 of the gas outlet pipe 255.

Accordingly, the vacuum heating device according to another embodiment of the present disclosure heats up the vent gas supplied into the chamber 200 from the outside while the vent gas passes through the internal pipe 259, thus it is possible to implement the fabrication apparatus of the display device of which the reliability increases by improving the problems such as a condensation phenomenon that moisture is condensed on the substrate because the internal temperature of the chamber 200 is rapidly changed and a problem that moisture and impurities are adhered and clogged at the gas outlet 257.

Although the present invention has been explained by the embodiments described above, it should be understood to the ordinary skilled person in the art that the present disclosure is not limited to the embodiments, but rather that various changes or modifications thereof are possible without departing from the spirit of the present disclosure. Accordingly, the scope of the present disclosure shall be determined only by the appended claims and their equivalents.

The invention claimed is:

1. A fabrication apparatus of a display device comprising:
a chamber for vacuum heating;
a plurality of hot plates disposed at an inside of the chamber and each including a bottom surface;
a plurality of external pipes that are disposed at an outside of the chamber, and to which vent gas for converting an atmospheric pressure of the inside of the chamber, which is in a vacuum state, into the atmospheric pressure of the outside is supplied;
an internal pipe extended from an external pipe and located at the inside of the chamber, and disposed under the bottom surface of an adjacent one of the hot plates; and
a gas outlet pipe which is extended from the internal pipe and discharges the vent gas into the chamber,
wherein the internal pipe has a plurality of bent portions disposed under the bottom surface of the adjacent one of the hot plates.

2. The fabrication apparatus of a display device according to claim 1, wherein both ends of the internal pipe are connected to the external pipe.

3. The fabrication apparatus of a display device according to claim 1, wherein the internal pipe is bent in an upper direction along the inner side surface of the chamber at a central area to be connected to the gas outlet pipe.

4. The fabrication apparatus of a display device according to claim 1, wherein the plurality of the hot plates includes a plurality of support pins for supporting a substrate.

5. The fabrication apparatus of a display device according to claim 1, wherein the vent gas is heated by the adjacent one of the hot plates as the vent gas flows in the internal pipe before the vent gas is discharged into the chamber through the gas outlet pipe.

6. The fabrication apparatus of a display device according to claim 1, wherein the internal pipe is spaced from the bottom surface of the adjacent one of the hot plates along a height direction of the chamber.

7. The fabrication apparatus of a display device according to claim 1, the gas outlet pipe is connected to the internal pipe and is disposed above the internal pipe such that the vent gas is discharged into the chamber at a position higher than a position of the hot plates in the chamber.

* * * * *